United States Patent [19]
Moriyama

[11] Patent Number: 5,684,333
[45] Date of Patent: Nov. 4, 1997

[54] WAFER STRUCTURE IN A SEMICONDUCTOR DEVICE MANUFACTURING PROCESS

[75] Inventor: Norio Moriyama, Tokyo, Japan

[73] Assignee: Oki Electric Industry Co., Ltd., Tokyo, Japan

[21] Appl. No.: 571,513

[22] Filed: Dec. 13, 1995

Related U.S. Application Data

[63] Continuation of Ser. No. 293,148, Aug. 19, 1994, Pat. No. 5,496,777.

[30] Foreign Application Priority Data

Aug. 26, 1993 [JP] Japan ........................ 5-234144

[51] Int. Cl.⁶ .................. H01L 23/544; H01L 29/06; H01L 21/302; H01F 1/03
[52] U.S. Cl. .................. 257/797; 257/620; 257/618; 257/622; 437/924; 437/227; 148/DIG. 102
[58] Field of Search ................ 257/797, 620, 257/48, 618, 622; 437/924, 249, 227, 8; 148/DIG. 102, DIG. 28

[56] References Cited

U.S. PATENT DOCUMENTS

| 3,620,932 | 11/1971 | Crishal | 257/620 |
| 5,089,427 | 2/1992 | Schenberg | 257/620 |

FOREIGN PATENT DOCUMENTS

| 2-307206 | 12/1990 | Japan | 257/797 |
| 6-204101 | 7/1994 | Japan | 257/797 |

*Primary Examiner*—Mahshid D. Saadat
*Assistant Examiner*—Jhihan B. Clark
*Attorney, Agent, or Firm*—Jones & Volentine, L.L.P.

[57] ABSTRACT

Alignment marks used in different processes are arranged on scribing lines. The scribing lines are used for cutting off individual semiconductor devices formed on a wafer, and the alignment marks have widths which are larger than widths of the scribing lines. The width of areas corresponding to positions where alignment marks are formed are larger so as to accommodate the alignment marks within the areas. A part of the area of a used alignment mark is covered with a new film so that the area is permitted to have a scribing line having a desired width every time a used alignment is generated. A new alignment mark is arranged within other areas where an alignment mark is not formed. In such an arrangement of the alignment marks, the center line of the scribing line is made clear, and the area where the semiconductor devices are formed can be made large.

17 Claims, 6 Drawing Sheets

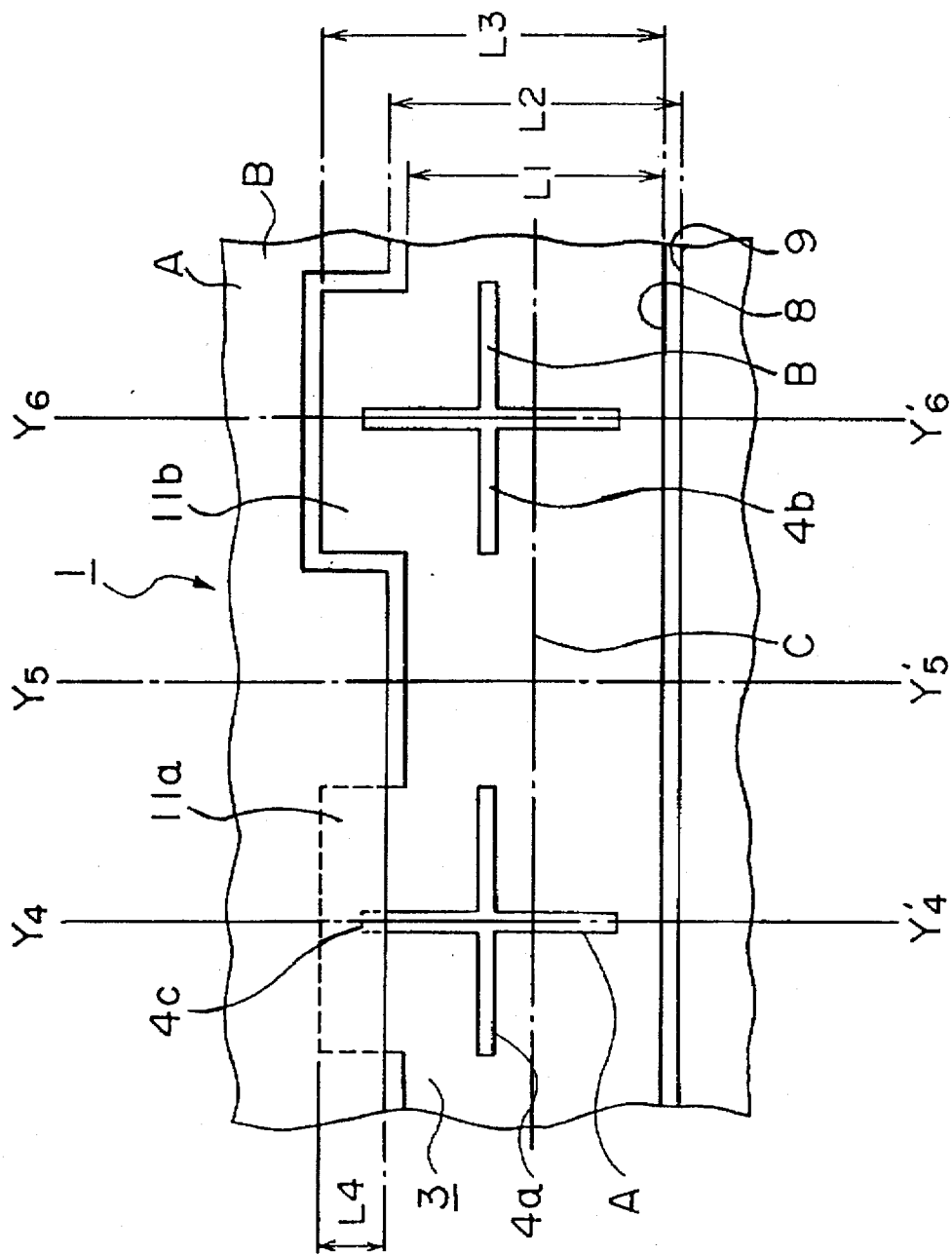

5,684,333

WAFER STRUCTURE IN A SEMICONDUCTOR DEVICE MANUFACTURING PROCESS

This is a Continuation of U.S. patent application Ser. No. 08/293,148, filed Aug. 19, 1994 U.S. Pat. No. 5,496,777.

BACKGROUND OF THE INVENTION

1. Field of the Invention

The present invention relates to alignment marks for use in a manufacturing process of a semiconductor device, and particularly to alignment marks on a wafer of the semiconductor device.

2. Prior Art

There are many processes which require alignment of alignment marks on a wafer in the manufacturing of a semiconductor device. For example, in the case of forming a film on the wafer and then forming a given pattern on the formed film, a reticle, having an original image of a pattern, and the wafer are accurately aligned with each other, and thereafter the image or pattern on the reticle is exposed on the film. Such an alignment is performed by aligning an alignment mark on the reticle with an alignment mark on the wafer.

Such an alignment mark on the wafer is frequently formed on a scribing line. The scribing line is a cutting portion when a plurality of semiconductor devices formed on the wafer are individually cut off in pieces.

SUMMARY OF THE INVENTION

It is an object of the invention to provide alignment marks so as not to enlarge the width of a scribing line and clearing a center line of the scribing line, even if large alignment marks are provided on the scribing line.

To achieve the object of the invention, the invention provides a wafer structure in a semiconductor device manufacturing process by a method of arranging alignment marks that comprises preparing a semiconductor wafer having scribing lines, each scribing line comprising a first area having a first width, a second area having a second width which is larger than the first width, and a third area having a third width which is larger than the first width, wherein a first alignment mark is arranged within the second area, covering the second area with a first film so that the width of the second area is substantially the same as the first width of the first area, and arranging a second alignment mark within the third area.

The object according to the present invention is achieved by the provision of a wafer structure in a semiconductor device manufacturing process that comprises a plurality of semiconductor structures on a semiconductor wafer having scribing lines between the plurality of structures. Each of the scribing lines comprises a first area having a first width, a second area having a second width larger than the first width and a third area having a third width larger than the first width. A first alignment mark is arranged within the second area, and a first film covers the second area so that the second area has a fourth width defined by the first film closer to the first width of the first area than the second width of the second area. A second alignment mark is provided within the third area.

Preferably, the first film covers each of the plurality of semiconductor structures. The second width is substantially the same as the third width. Furthermore, the first film and the second alignment mark are preferably made of the same material. The first alignment mark comprises an oxide film, with the first film in the second alignment mark comprising a BPSG film.

The first alignment mark is partially covered by the first film, whereas the scribing lines are not covered by the first film.

The object according to the present invention is further accomplished by the provision of a wafer structure in a semiconductor device manufacturing process that comprises a semiconductor wafer having a plurality of semiconductor structures thereon that are separated from each other by scribing lines. One of the semiconductor structures has one of the scribing lines separating the one of the semiconductor structures from another of the semiconductor structures adjacent thereto. The one of the scribing lines has a first area having a first width between the one and the other of the semiconductor structures. A second area has a second width larger than the first width between the one and the other of the semiconductor structures, and the third area has a third width larger than the first width. At least one recess is defined in at least one of the one and the other of the semiconductor structures, the at least one recess defining the second and third areas. A first alignment mark is arranged within the second area.

Preferably the first film covers both of the one and the other of the semiconductor structures, wherein the first film defines a fourth width across the one of the scribing lines that is greater than the first width and smaller than the second width at the second area.

The object according to the present invention is further achieved by the provision of a semiconductor device structure that comprises an area having a semiconductor structure on a semiconductor wafer. Scribing lines surround the area, with at least one of the scribing lines having a center line, a first edge with the area, a second edge with the area further from the center line than the first edge and a third edge with the area further from the center line than the first edge. A first alignment mark extends from the second edge towards the first edge, and a second alignment mark extends from the third edge toward the first edge. A first film cover the first alignment mark between the second edge and the first edge, with the first film having an edge adjacent to the first edge.

BRIEF DESCRIPTION OF THE DRAWINGS

FIG. 4 is another plan view showing the method of arranging alignment marks;

DETAILED DESCRIPTION OF THE INVENTION

Figure 1:
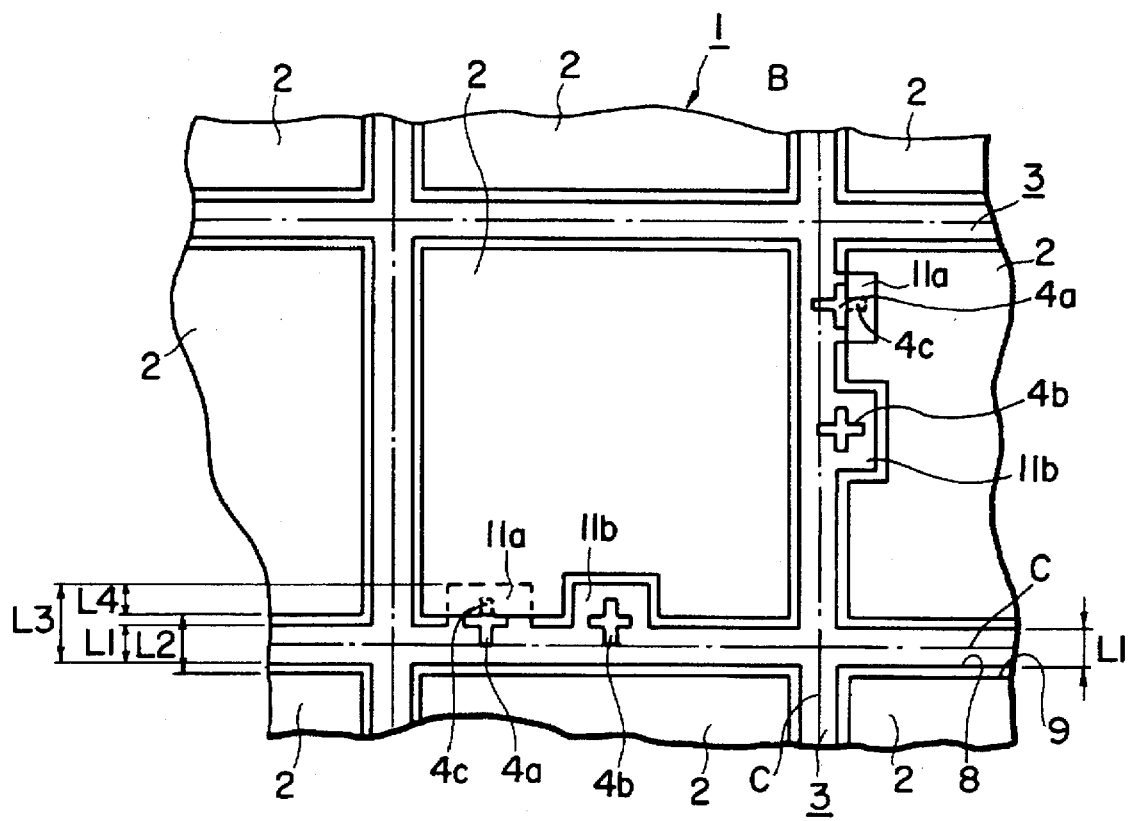
FIG. 1 is a plan view showing a part of a wafer on which semiconductor devices, undergoing a manufacturing process, are formed.

FIG. 1 is a plan view showing a part of a wafer on which semiconductor devices undergoing a manufacturing process are formed.

A plurality of semiconductor devices 2 are formed on a wafer 1. A plurality of scribing lines 3 are formed between structures on the wafer 1, i.e. the semiconductor devices 2 which are undergoing the manufacturing process. Center lines C of the scribing lines 3 are cut after the semiconductor devices 2 are manufactured so that the semiconductor devices 2 are cut into individual pieces.

Alignment marks 4a and 4b are formed on a first scribing line 8 by the number corresponding to the number of mask alignment during the manufacturing processes of the semiconductor device 2. The alignment marks 4a and 4b are each cross-shaped and formed on respective areas 11a and 11b each having a large width L3, which is larger than a width L1 of the first scribing line 8.

A part 4c of the alignment mark 4a is arranged in a width L4 of the area 11a, and it is covered with a BPSG film B constituting the semiconductor device 2 when the alignment mark 4a is no longer upon completion of a first alignment. That is, a second scribing line 9 is newly formed on the alignment mark 4a. At this time, a width L2 of the second scribing line 9 is set to be larger than the width L1 of the first scribing line 8. The alignment mark 4b is not covered with the BPSG film B so that it can be used in a second alignment. That is, the alignment mark 4b alone still has the function of an alignment mark. The alignment mark 4b is frequently formed at the same time as when the BPSG film B is formed.

A method of arranging the alignment marks is described in detail hereinafter with reference to FIGS. 2 to 5. Elements which are denoted with the same numerals as those of FIG. 1 represent the same elements, and the explanation thereof is omitted.

Figure 2:
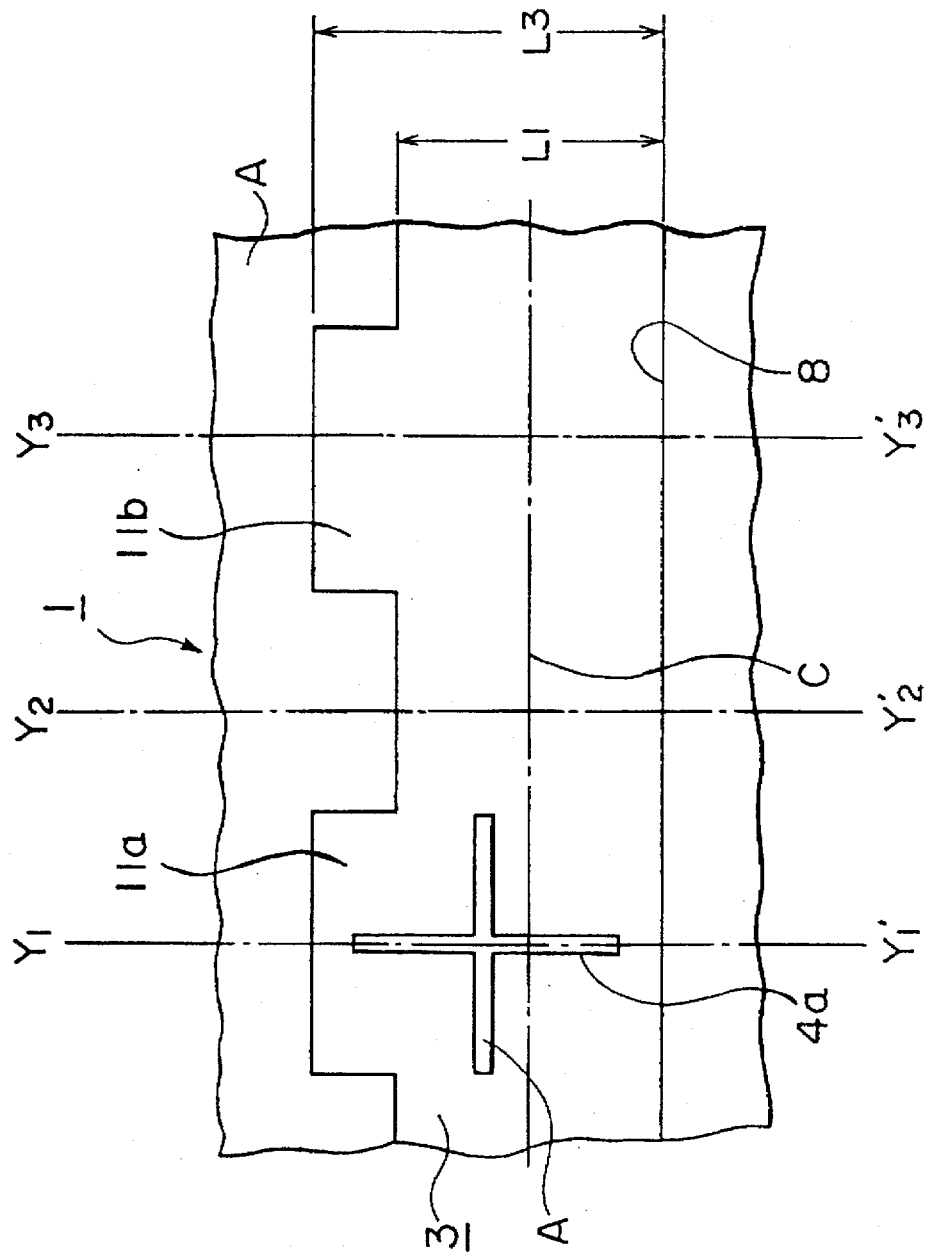
FIG. 2 is a plan view showing a method of arranging alignment marks.
Figure 3A:
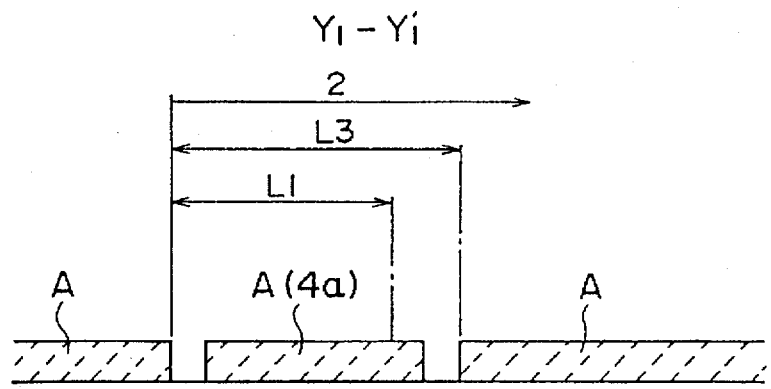
FIG. 3(A) is a cross-sectional view taken along $Y_1$—$Y_1$, of FIG. 2.
Figure 3B:
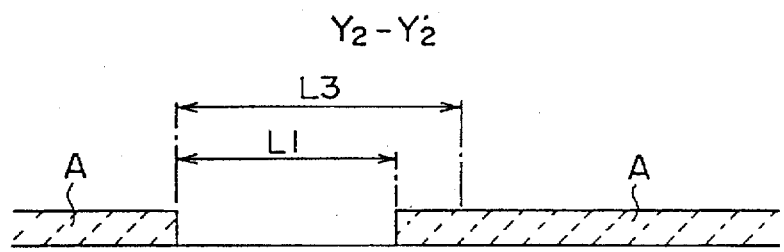
FIG. 3(B) is a cross-sectional view taken along $Y_2$—$Y_2$, of FIG. 2.
Figure 3C:
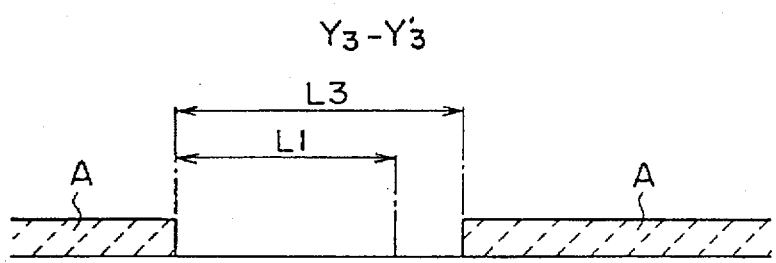
FIG. 3(C) is a cross-sectional view taken along $Y_3$—$Y_3$, of FIG. 2.

FIG. 2 is a plan view showing a method of arranging alignment marks, FIG. 3(A) is a cross-sectional view taken along $Y_1$—$Y_1$, of FIG. 2, FIG. 3(B) is a cross-sectional view taken along $Y_2$—$Y_2$, of FIG. 2, and FIG. 3(C) is a cross-sectional view taken along $Y_3$—$Y_3$, of FIG. 2.

Figure 5A:
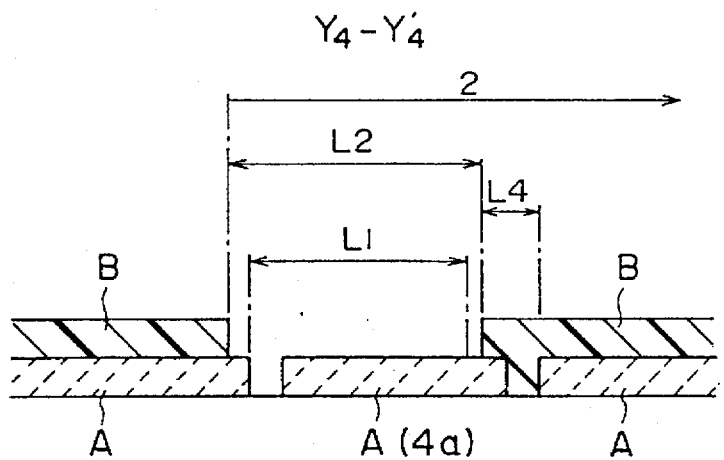
FIG. 5(A) is a cross-sectional view taken along $Y_1$—$Y_1$, of FIG. 4.
Figure 5B:
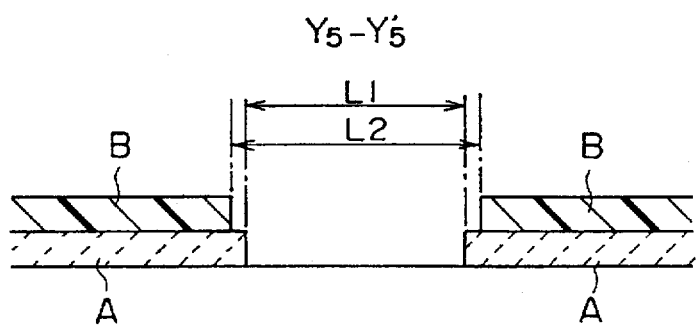
FIG. 5(B) is a cross-sectional view taken along $Y_2$—$Y_2$, of FIG. 4.
Figure 5C:
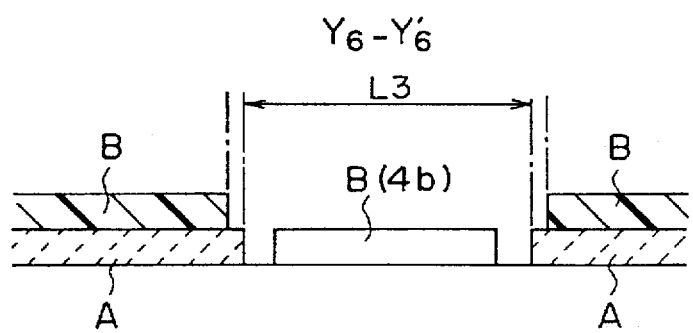
FIG. 5(C) is a cross-sectional view taken along $Y_3$—$Y_3$, of FIG. 4.

FIG. 4 is another plan view showing the method of arranging alignment marks, FIG. 5(A) is a cross-sectional view taken along $Y_1$—$Y_1$, of FIG. 4, FIG. 5(B) is a cross-sectional view taken along $Y_2$—$Y_2$, of FIG. 4, and FIG. 5(C) is a cross-sectional view taken along $Y_3$—$Y_3$, of FIG. 4.

As shown in FIGS. 2 and FIGS. 3(A) to 3(C), a selective oxide film A is formed on areas other than the first scribing line 8, which has the width L1 (FIG. 3(B)). There are formed areas 11a and 11b on the portion where the alignment marks 4a and 4b are formed. The areas 11a and 11b (hereinafter referred to as large areas) have a large width L3, larger than the widths of the alignment marks 4a and 4b. At this time, the alignment mark 4a is formed within the large area 11a (FIG. 3(A)). The alignment mark 4b is not formed at this time, but the large area 11b is secured as a preset forming area of the alignment mark 4b (FIG. 3(C)).

A mask alignment in a subsequent process is performed with the alignment mark 4a.

The alignment mark 4a is subjected to a plurality of subsequent processes, namely, subjected to processes several times, such as an electrode forming process having an etching process. As a result, the alignment mark 4a is gradually thinner in its thickness and is roughened on its surface. If the mask alignment is continued using such an alignment mark 4a, the alignment accuracy deteriorates.

As shown in FIGS. 4 and 5, the alignment mark 4b is formed within the large area 11b at the time when the BPSG film B is used for insulating between an electrode and wiring (FIG. 5(C)). At this time, the width L2 of the second scribing line 9 is larger than the width L1 of the first scribing line 8 (FIG. 5(B)). Further, since the alignment mark 4a has already completed its function and is no longer used, the width L4 within the large area 11a is covered with the BPSG film B (FIG. 5(A)). That is, the part 4c of the alignment mark 4a is covered with the BPSG film B. Accordingly, the alignment mark 4a loses its function as an alignment mark.

The alignment mark 4b is used for the mask alignment in the subsequent processes.

Accordingly, the method of arranging the alignment marks comprises (a) providing the large areas 11a and 11b which partially widen the first scribing line 8, (b) performing mask alignment using the alignment mark 4a which is formed within the large area 11a of the large areas 11a and 11b, (c) thereafter, when the alignment mark 4a is no longer used, forming a subsequent alignment mark 4b within the large area 11b and at the same time covering part of the alignment mark 4a with the BPSG film B.

Further, the alignment mark 4b and the alignment marks formed thereafter are likewise partially covered with the BPSG film when they are no longer used. Accordingly, the large area 11a and 11b, which partially widen the scribing lines, are not present when the final process is completed so that the scribing lines, each having a given width, alone remain on the wafer.

Accordingly, it is possible to prevent the center lines of the scribing lines from being unclear when the semiconductor devices 2 are cut into individual pieces.

Furthermore, according to the present method of arranging the alignment marks, the scribing lines, each having a given width, alone remain on the wafer irrespective of the size of the alignment mark when the final process is completed. Accordingly, the number of semiconductor devices 2 that can be formed on a piece of wafer 1 is increased as compared with the case where a given width of the scribing line is set large beforehand depending on the sizes of the alignment marks.

According to the preferred embodiment of the present invention, the alignment marks 4a and 4b are formed of the selective oxide film A and the BPSG film B, respectively, but they can also be formed of an electrode material such as polysilicon.

Although the alignment marks 4a and 4b are cross-shaped, they may be V-shaped or rod-shaped, or the like.

As described in detail above, according to the present method of arranging the alignment marks, since a part of the alignment mark is covered with a film when the alignment mark is no longer used, the widened portion is scarcely present along the scribing line, and the scribing line having the given width alone remains when the final process is completed. Accordingly, the center line of the scribing line is made clear.

Figure 6:
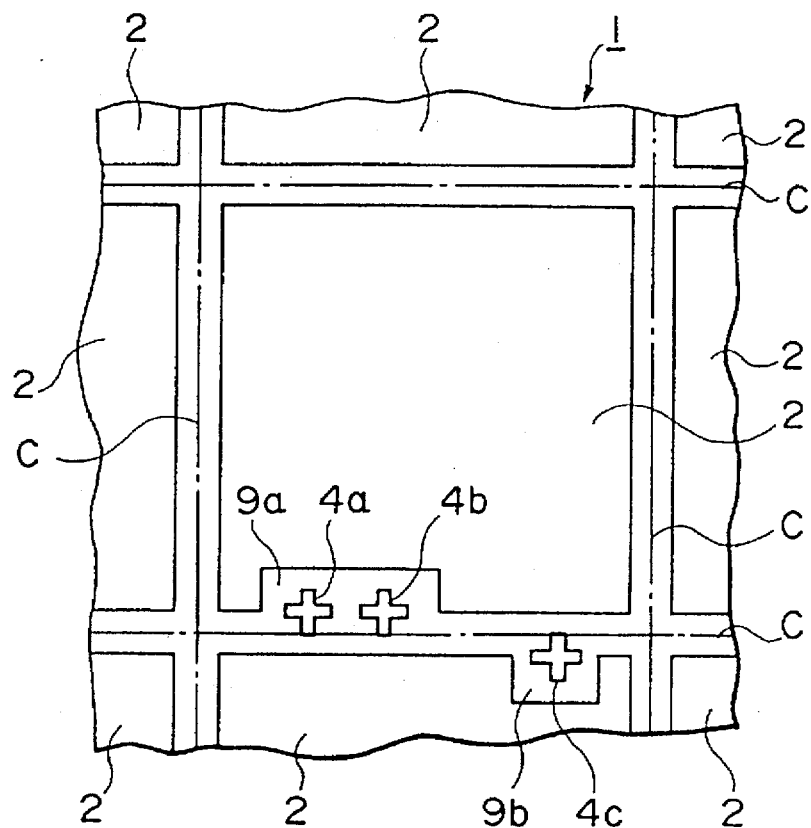
FIG. 6 is a plan view showing a part of another wafer on which a semiconductor device, undergoing a manufacturing process, is formed.

That is, even if the scribing lines are appropriately widened merely at the portions necessary for providing the alignment marks, many widened portions present on the scribing line when the final process is completed makes the center lines of the scribing lines unclear (FIG. 6). However, according to the present method of arranging alignment marks, it is possible to prevent the center lines of the scribing lines from being unclear.

It is possible to increase the number of semiconductor devices 2 to be formed on a piece of wafer 1 as compared with the case where the given widths of the scribing lines are set large beforehand in dependence on the sizes of the alignment marks.

Figure 7:
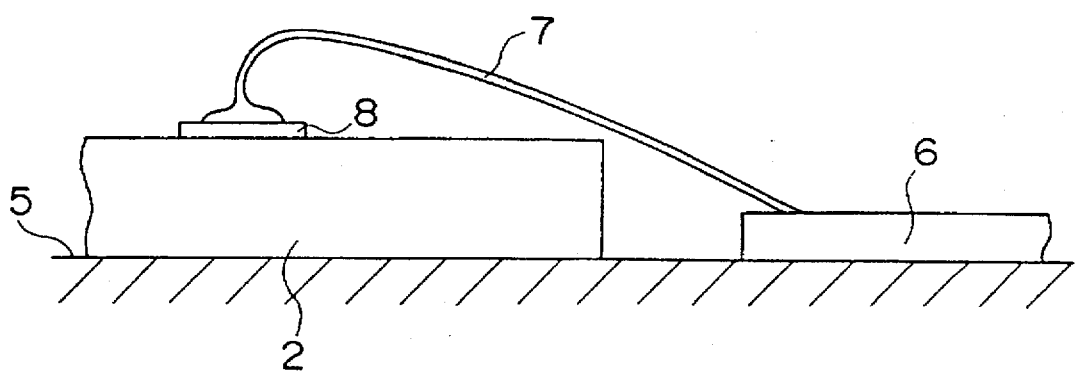
FIG. 7 is a view showing a state where the semiconductor device is connected to a lead by a wire.

The semiconductor device 2 is attached to a die pad 5 after it is cut off from the wafer 1, as shown in FIG. 7. Thereafter, the semiconductor device 2 is connected to a lead 6 by a wire 7 such as Au, etc. by way of a pad 18. If the given width of the scribing line is set large, in this connecting process, a problem occurs in that the wire 7 contacts the semiconductor device 2.

As can be seen in FIGS. 1 and 5, for example, the majority of the areas such as 11a are covered by the film B such that the width of the areas becomes nearly the width of the scribing line.

According to the method of arranging alignment marks discussed above, a wafer structure in the semiconductor manufacturing process results. The wafer structure results in a plurality of semiconductor structures such as devices 2 on the semiconductor wafer 1 having scribing lines 3 between the plurality of structures. Each of the scribing lines 3 comprises a first area having a first width L1, a second area having a second width larger than the first width L3 and a third area having a third width larger than the first width L3. The first alignment mark 4a is arranged within the second area, and the first film B covers the second area so that the second area has a fourth width defined by the first film closer to the first width of the first area than the second width of the second area. A second alignment mark 4b is then within the third area.

One of the semiconductor structures is provided within an area on the wafer. The scribing lines surround this area, with at least one of the scribing lines having the center line C. A first edge of the scribing line with the area is at the width L1, where second and third edges of the scribing line with the area, further from the center line than the first edge, are at the width L3. Thus, the first alignment mark 4a extends from the second edge toward the first edge, and the second alignment mark 4b extends from the third edge toward the first edge. The first film B covering the first alignment mark 4a between the second edge and the first edge forms an edge that is adjacent to the first edge, and almost collinear therewith, as illustrated in the various drawing figures.

What is claimed is:

1. A wafer structure for a semiconductor device manufacturing process, comprising:
   a plurality of semiconductor structures on a semiconductor wafer having scribing lines extending lengthwise and widthwise between said plurality of semiconductor structures such that adjacent ones of said semiconductor structures confront each other across a width of a scribing line extending therebetween, wherein each of said scribing lines comprises between an adjacent pair of semiconductor structures a first area having a first length and a first width, a second area having a second length and a second width and a third area having a third length and a third width, said second and third widths each being larger than said first width;
   a first alignment mark within said second area;
   a first film partially covering said second width of said second area such that a remaining non-covered portion of said second area has a fourth width which is closer in width to said first width of said first area than to said second width of said second area; and,
   a second alignment mark within said third area.

2. The wafer structure of claim 1, wherein said first film covers each of said plurality of semiconductor structures.

3. The wafer structure of claim 1, wherein said second width is substantially the same as said third width.

4. The wafer structure of claim 1, wherein said first film and said second alignment mark are made of the same material.

5. The wafer structure of claim 1, wherein said first alignment mark is partially covered by said first film.

6. The wafer structure of claim 1, wherein a remainder of said scribing lines other than a partially covered portion of said second width of said second area is not covered by said first film.

7. The wafer structure of claim 4, wherein said first alignment mark comprises an oxide film, and said first film and said second alignment mark comprise a BPSG film.

8. A wafer structure for a semiconductor device manufacturing process, comprising;
   a semiconductor wafer having a plurality of semiconductor structures thereon that are separated from each other by scribing lines extending lengthwise and widthwise between said plurality of semiconductor structures such that adjacent ones of said semiconductor structures confront each other across a width of a scribing line extending therebetween,
   wherein one of said semiconductor structures has one of said scribing lines separating said one of said semiconductor structures from another of said semiconductor structures adjacent thereto,
   wherein said one of said scribing lines has a first area having a first length and a first width between said one and said other of said semiconductor structures, a second area having a second length and a second width between said one and said other of said semiconductor structures, and a third area having a third length and a third width between said one and said other of said semiconductor structures, wherein said second and third widths are each larger than said first width, and
   wherein at least one recess is defined in at least one of said one and said other of said semiconductor structures, said second and third areas partially contained within said at least one recess; and
   a first alignment mark within said second area.

9. The wafer structure of claim 8, wherein said first alignment mark has a width greater than said first width.

10. The wafer structure of claim 8, and further comprising a first film at least partially covering said second area and partially covering said first alignment mark.

11. The wafer structure of claim 10, wherein said third area is uncovered by said first film.

12. The wafer structure of claim 11, and further comprising a second alignment mark arranged within said third area.

13. The wafer structure of claim 12, wherein said first film and said second alignment mark are made of the same material.

14. The wafer structure of claim 13, wherein said first film and said second alignment mark comprise a BPSG film.

15. The wafer structure of claim 12, wherein said first film covers both of said one and said other of said semiconductor structures, and wherein said first film partially covers said second width of said second area so as to define a fourth width of a remaining non-covered portion of said second area, said fourth width being greater than said first width and smaller than said second width.

16. The wafer structure of claim 14, wherein said first alignment mark comprises an oxide film.

17. A semiconductor device structure, comprising;

a device area having a semiconductor structure on a semiconductor wafer;

a scribing area surrounding said device area and defining at least one scribing line extending lengthwise therein and adjacent said device area, said scribing area having a first edge extending lengthwise and contiguous with said device area, a second edge extending lengthwise and contiguous with said device area and a third edge extending lengthwise and contiguous with said device area, wherein said second and third edges are each spaced further from said scribing line than said first edge;

a first alignment mark located between said second edge and said first edge;

a second alignment mark located between said third edge and said first edge;

a first film covering said second edge so as to partially cover said first alignment mark between said second edge and said first edge, said first film having an edge adjacent to said first edge.

* * * * *